(12) United States Patent
Ariel

(10) Patent No.: US 7,375,291 B2
(45) Date of Patent: May 20, 2008

(54) STRIP GASKETS FOR EMI SHIELDING

(75) Inventor: John C. Ariel, Nashua, NH (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 11/436,359

(22) Filed: May 18, 2006

(65) Prior Publication Data
US 2006/0260838 A1   Nov. 23, 2006

Related U.S. Application Data

(60) Provisional application No. 60/682,645, filed on May 19, 2005.

(51) Int. Cl.
*H05K 9/00* (2006.01)
(52) U.S. Cl. .................. 174/358; 174/370; 277/920
(58) Field of Classification Search .......... 174/370, 174/358; 277/920; 361/816, 818
See application file for complete search history.

(56) References Cited

U.S. PATENT DOCUMENTS

| | | | |
|---|---|---|---|
| 4,937,128 A * | 6/1990 | Quiles .................. | 428/156 |
| 5,008,485 A | 4/1991 | Kitagawa | |
| 5,028,739 A | 7/1991 | Keyser et al. | |
| 5,068,493 A * | 11/1991 | Benn et al. ............. | 174/354 |
| 5,105,056 A | 4/1992 | Hoge, Jr. et al. | |
| 5,202,536 A | 4/1993 | Buonanno | |
| 6,075,205 A * | 6/2000 | Zhang ................ | 174/358 |
| 6,116,615 A * | 9/2000 | Trehan ............... | 277/630 |
| 6,121,545 A | 9/2000 | Peng et al. | |

FOREIGN PATENT DOCUMENTS

WO   WO 2005/004573   *   1/2005

* cited by examiner

*Primary Examiner*—Hung V Ngo
(74) *Attorney, Agent, or Firm*—Rissman Jobse Hendricks & Oliverio, LLP

(57) ABSTRACT

A strip gasket utilizing a low closure force on an enclosing face for shielding electromagnetic interference is disclosed. The strip gasket includes an outer surface and an inner surface. The inner surface provides a hollow cross section region. Bending moments are created on surface peripheries of the inner surface and the outer surface, or both, to provide a low closure force on an enclosing face. The bending moment results in an increased surface area of the strip gasket providing a low resistance. Cauchy's stress analysis reveals that a lower force is required to compress the strip gasket as compared to conventional strip gaskets.

8 Claims, 16 Drawing Sheets

STRIP GASKETS FOR EMI SHIELDING

CROSS-REFERENCE TO RELATED APPLICATIONS

This application claims the benefit of priority of U.S. Provisional Application No. 60/682,645 filed on May 19, 2005, the specification of which is incorporated herein by reference.

BACKGROUND OF THE INVENTION

The present invention relates to shielding gaskets, and more specifically to a strip gasket utilizing a low closure force on an enclosing face to provide electromagnetic interference (EMI) shielding or radio frequency interference (RFI) shielding.

The operation of electronic equipment, such as televisions, radios, computers, medical instruments, business machines, communication equipments, and the like, is typically accompanied by the generation of radio frequency and/or electromagnetic radiation within electronic circuitries of an electronic system. The increasing operating frequency in commercial electronic enclosures, such as doors and access panels, housings for shielding computer cabinets and drives, cathode ray tubes (CRTs) and automotive electronic modules, results in an elevated level of high frequency electromagnetic interference (EMI). Any gap between the metal surface confronting or mating with the doors and access panels affords an opportunity for the passage of electromagnetic radiation and the creation of electromagnetic interference (EMI). These gaps also interfere with the electric currents running along the surfaces of the cabinets from EMI energy, which is absorbed and is conducted to the ground.

If not properly shielded, such radiation can cause considerable interference with unrelated equipment. Accordingly, it is necessary to effectively shield and ground all sources of radio frequency and electromagnetic radiation within the electronic system. Therefore, it is advisable to use a conducting shield or gasket between such surfaces to block the passage of the electromagnetic interference (EMI).

To attenuate EMI effects, shielding gaskets having the capability of absorbing and/or reflecting EMI energy may be employed both to confine the EMI energy within a source device, and to insulate that device or other "target" devices from other source devices. Such shielding is provided as a barrier which is inserted between the source and the other devices, and is typically configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, gaps may be present which reduce the efficiency of the shielding by containing openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having a less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and functions to close any interface gaps to establish a continuous conductive path there across by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capable of withstanding repeated compression and relaxation cycles.

Conductive materials for the filler, sheathing, or coating include metal or metal-plated particles, fabrics, meshes, and fibers. Preferred metals include copper, nickel, silver, aluminum, tin, or an alloy such as Monel, with preferred fibers and fabrics including natural or synthetic fibers such as cotton, wool, silk, cellulose, polyester, polyamide, nylon, and polyimide. Alternatively, other conductive particles and fibers such as carbon, graphite, or a conductive polymer material may be substituted.

These shielding devices are available in a wide range of sizes and can be supplied on continuous rolls or cut to length. Generally, these shielding devices are attached to the housing by rivets, welds, screws, etc., preferably, a continuous roll-formed strip metal clip, to which a shielding device has been attached, is used.

U.S. Pat. No. 5,008,485, issued to Kitagawa, discloses a conductive EMI shield including an inner seal member formed of an elastic, nonconductive material such as rubber or the like, and an outer conductive layer coated over the sealing member. Portions of the conductive layer extend beyond the seal member to directly contact the edges of a housing to which the sealing member is attached. The conductive layer is formed of a conductive compound comprising a resinous material which is filled with carbon black, a metallic powder, or the like to render it electrically conductive.

U.S. Pat. No. 5,028,739, issued to Keyser et al., discloses an EMI shielding gasket including a resilient, elastomeric core enveloped within a fine, open format knit or braided wire mesh. An adhesive strip is disposed lengthwise along a surface of the gasket allowing the gasket to be removably fastened directly to an enclosure.

U.S. Pat. No. 5,105,056, issued to Hoge, Jr., et al., discloses an EMI shielding gasket formed from a conductive sheathing which is wrapped circumferentially around a compressible core. Where the sheathing overlaps itself, a longitudinal seam is defined to which an adhesive is applied for bonding the gasket to a panel of an enclosure or the like. Preferably, the adhesive is applied discontinuously in a repetitive pattern of non-overlapping lines extending laterally across the seam.

U.S. Pat. No. 5,202,536, issued to Buonanno, discloses an EMI seal having an elongated resilient core which is covered with a partial conductive sheath. A conductive portion of the sheath, preferably a metallized fabric or the like in a resin binder, is provided to extend partially around the core to define ends which are non-overlapping. A second, nonconductive sheath portion is attached to the core element to extend between the ends of the conductive sheath portion. A contact adhesive may be used to hold the seal in place.

U.S. Pat. No. 6,121,545, issued to Peng, et. al., discloses a gasket providing a low closure force, particularly adapted for use in smaller electronic enclosure packages. The disclosed gasket has been designed to form a periodic "interrupted" pattern of alternating local maxima and minima heights. Gaskets of such type may be formed by molding, or using the form in place (FIP) process, and have a crenelated, i.e., notched, serrated, or a sinusoidal "waveform" profile, or as a series of discrete beads. In general, for a specified joint configuration, a gasket having such an "interrupted" profile or pattern would be expected to exhibit a greater deflection under a given compressive load than a continuous profile.

Another method of achieving a lower closure force in a spacer gasket design is described in commonly-assigned U.S. Pat. No. 6,121,545, issued to Peng et. al. This method involves configuring the gasket as having a moment arm portion which is angularly deflectable in an inward or outward direction relative to the frame responsive to a compressively-applied load. As a result of the described bending mode response, such gasket is seen to exhibit a force deflection as compared to gasket profiles operating in a conventional compression mode.

A typical small enclosure application generally requires a low impedance, low profile connection which is deflectable under relatively low closure force loads, e.g., about 1.0-8.0 lbs per inch (0.2-1.5 kg per cm) of gasket length. The deflection ensures that the gasket sufficiently conforms to the mating housing or board surfaces to develop an electrically conductive pathway therebetween. It has been observed that for certain applications, however, the closure or other deflection force required for certain conventional profiles may be higher than can be accommodated by the particular housing or board assembly design.

While the aforementioned and other known gaskets perform reasonably well, these gaskets are relatively costly to assemble in a cabinet. Moreover, the tightly knit wire mesh necessitates that a high closure force is required to seal the door or panel, and the combination of the tightly knit mesh and the required metal clip makes the gasket heavy, which is detrimental in applications where weight is a critical factor such as in the aerospace industry.

As the size of handheld electronic devices, such as cellular phone handsets, has continued to shrink, further improvements in the design of gasket profiles would be well-received by the electronics industry. Specifically, it is desirable to provide a low closure force gasket profile for use in smaller electronics enclosures which are increasingly becoming the industry standard.

Therefore, there is a need for a shielding gasket having a resilient core with a particular structure which is inexpensive and lightweight and allows a low closure force with an enclosing surface. The shielding gasket should also provide superior compression-deflection properties which are highly desirable in complex enclosures. Furthermore, the shielding gasket should be capable of being utilized in various bending curvatures of the enclosing surface, and be available in various shapes and profiles, such as asymmetrical or flat rectangular, C shape, V shape, D shape, P shape, etc., to accommodate new designs.

It is accordingly an objective of the present invention to provide a strip gasket which has a hollow cross section providing a lightweight structure and flexibility in fixing to an enclosing surface.

It is another objective of the present invention to provide a strip gasket which allows an enclosing surface to be sealed with a low closure force.

A further objective of the present invention is to provide a strip gasket which allows a lower electrical resistance.

SUMMARY OF THE INVENTION

To address the foregoing and other deficiencies of the prior art, the present invention provides a strip gasket having a hollow cross sectional region for shielding against electromagnetic interference (EMI), radio frequency interference (RFI), and environmental sealing.

The strip gasket of this invention provides EMI/RFI shielding and environmental sealing in a number of electronic enclosures, such as doors and access panels, housings for shielding computer cabinets and drives, cathode-ray tubes (CRT) and automotive electronic modules. The strip gasket can be applied to desired portions or locations of the electronic enclosures.

The strip gasket is provided with an inner surface and an outer surface. The inner surface of the strip gasket is configured to provide a hollow cross section region. The inner surface and outer surface of the strip gasket have one or more bending moments. Alternatively, the bending moments can be created either on the inner surface or outer surface of the gasket. The strip gasket provides a low closure force and a low resistance, and therefore makes it ideal for shielding EMI/RFI.

In an embodiment, a strip gasket having an O-shape is described. The disclosed O-shaped strip gasket is provided with an inner surface and an outer surface having one or more bending moments. The inner surface is configured to provide a hollow cross sectional region. The bending moment is defined by the embossed pattern generated on peripheries of the inner and outer surfaces. The bending moment thus created increases the surface area resulting in a low resistance across the gasket.

The Nonlinear Finite Element Analysis (FEA) approach is used to analyze the effect of Cauchy stress on the strip gasket. The static load-compression responses of the disclosed gasket profiles configured in accordance with the invention are predicted using a nonlinear finite element analysis (FEA) modeling program, MARC K6 (MARC Analysis Research Corp., Palo Alto, Calif.). The force vs. compression plot of the strip gasket shows that the curve of the strip gasket of this invention is observed to lie below the curve of a conventional strip gasket. At a particular force of 0.2 lbs/inch, the strip gasket of this invention is compressed to 15 units (0.004" per increment), as compared to a conventional strip gasket which is compressed to 5 units (0.004" per increment).

In alternate embodiments, the strip gasket of the invention can be provided with a hollow cross section of a D-shape, a P-shape, or any combination thereof. The bending moments are embossed on an inner and an outer surface of the strip gasket. Alternately, the bending moments can either be embossed on an inner surface or an outer surface of the gasket.

The strip gasket is typically made of resilient core elements and conductive sheath elements. The resilient core element is typically formed of elastomeric foam which may be a foamed elastomeric thermoplastic such as a polyethylene, polypropylene, polypropylene-EPDM blend, butadiene, styrene-butadiene, nitrile, chlorosulfonate, foamed neoprene, foamed urethane, or foamed silicone. Alternatively, an un-foamed silicone, urethane, neoprene, or thermoplastic may be utilized in either a solid or tubular form.

The sheathing may be provided as a woven or non-woven fabric, or as a knitted mesh. The fabric or mesh may be formed of a metal wire such as copper, nickel, silver, aluminum, tin or an alloy such as Monel, or of other conductive fibers such as carbon, graphite, or a conductive polymer. Alternatively, nonconductive natural or synthetic fibers such as cotton, wool, silk, cellulose, polyester, polyamide, nylon, polyimide, or the like may be plated or otherwise coated with a conductive material such as metal, carbon, or the like. Depending upon the needs of the specific application for the seal, a combination of conductive and nonconductive fibers may be used. The sheathing may also be provided as a laminate of a nonconductive fabric and a conductive metal foil formed from copper, aluminum, or another metal. Preferred sheathing materials, however, include nylon or polyester yarn plated with silver, copper, nickel, or tin.

BRIEF DESCRIPTION OF THE DRAWINGS

The present invention is illustrated by way of example and not limitation in the accompanying figures, in which like references indicate similar elements, and in which.

Figure 1:
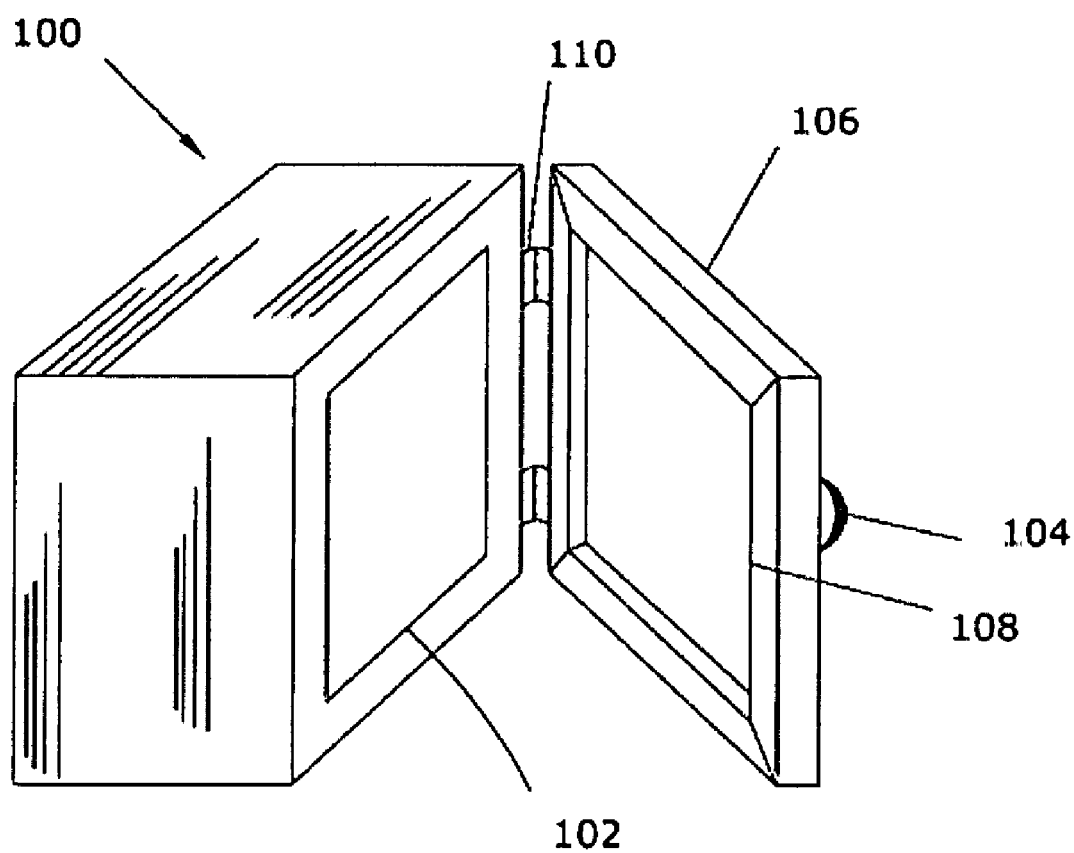
FIG. 1 represents an enclosure with an attached strip gasket therein, in accordance with an exemplary embodiment of the present invention.

Skilled artisans will appreciate that elements in the figures are illustrated for simplicity and clarity, and have not necessarily been drawn to scale. For example, the dimensions of some of the elements in the figures may be exaggerated relative to other elements to help improve the understanding of the embodiments of the present invention.

DETAILED DESCRIPTION OF THE INVENTION

The present invention is directed to a shielding gasket. More particularly, the present invention discloses a strip gasket providing electromagnetic interference (EMI) or radio frequency interference (RFI) shielding on complex enclosing surfaces. The strip gasket includes an outer surface, an inner surface and multiple bending moments. The inner surface provides a hollow cross section region. The bending moments are created on surface peripheries of the inner surface and the outer surface, or both, to provide a low closure force on an enclosing surface.

Surface irregularities prevent two surfaces from mating completely at all points, when these are brought into a contact. The gaps may be minute, but they provide leakage paths for EMI energy, even when very high closure forces are applied. In order to achieve complete mating, a gasket of resilient material is installed between the surfaces. When a closure pressure is applied, the gasket conforms itself to the irregularities in both mating surfaces, and accommodates itself to the gradations in local compression throughout the joint, thus sealing it completely. In the same way, if the resilient gasket incorporates metal distributed around or through its volume in mesh or particle form, the joint can be sealed against penetration by electromagnetic energy, thereby restoring the conductivity and shielding integrity of an enclosure.

The strip gasket provides EMI/RFI shielding and/or environmental sealing in a number of electronic enclosures, such as doors and access panels, housings for shielding computer cabinets and drives, cathode-ray tubes (CRT) and automotive electronic modules. The strip gasket can be applied to desired portions or locations of the electronic enclosures.

The conventional EMI shielding gaskets involve a resilient core element having gap-filling capabilities, around which a conductive, tubular sleeve or other sheathing is provided. The resilient core element is typically formed of an electrically conductive elastomer foam which may be a foamed elastomeric thermoplastic such as a polyethylene, polypropylene, polypropylene-EPDM blend, butadiene, styrene-butadiene, nitrile, chlorosulfonate, or a foamed neoprene, urethane, or silicone. Alternatively, an un-foamed silicone, urethane, neoprene, or thermoplastic may be utilized in either a solid or tubular form.

The sheathing may be provided as a woven or non-woven fabric, or as a knitted mesh. The fabric or mesh may be formed of a metal wire such as copper, nickel, silver, aluminum, tin, or an alloy such as Monel, or of other conductive fibers such as carbon, graphite, or a conductive polymer. Alternatively, nonconductive natural or synthetic fibers such as cotton, wool, silk, cellulose, polyester, polyamide, nylon, polyimide, or the like may be plated or otherwise coated with a conductive material such as metal, carbon, or the like. Depending upon the needs of the specific application for the seal, a combination of conductive and nonconductive fibers may be used. The sheathing may also be provided as a laminate of a nonconductive fabric and a conductive metal foil formed of copper, aluminum, or another metal. Preferred sheathing materials include nylon or polyester yarn plated with silver, copper, nickel, or tin.

There are several criteria used to measure the performance of an EMI gasket. For example, electrical performance is measured by the surface resistivity in ohm/square at a given compressive load. A low resistivity is desired as this means that the surface conductivity of the gasket is high. EMI shielding performance is measured in decibels over a range of frequencies ranging from 20 MHz to 18 GHz, wherein a constant decibel level over this range is preferred. The gasket performance also depends on the thickness of the conductive metal component of the gasket sheath; a thicker layer provides better performance than a thinner layer.

The shielding gaskets also offer a low closure force during normal operation. The closure force can be defined as the force required for closing the door or panel while obtaining the necessary deflection of the gasket so as to ensure proper electrical mating of the door to the frame through the gasket. Typically, the closure force required is less than 5 pounds/linear inch. The shielding devices can be easily compressed to a maximum of 75% of their height without scratching or abrading the mating surfaces. For radiation frequencies between 30 megahertz and 3 gigahertz, it is known to utilize conductive mesh materials, supported internally by an elastomeric core or other similar element, in order to provide adequate shielding.

The strip gasket is available in different types such as molded gaskets, extruded gaskets, and reinforced gaskets for typical applications. Typical applications include, but are not limited to, electronic bay doors, wing panel access covers, engine pylons, and radomes. The strip gasket can be designed and developed for customized cross sections and shapes to meet specific applications.

Extruded gaskets are available either in a hollow structure or a solid structure. These gaskets are also available in various cross sectional shapes such as Round, "D" shapes, rectangular shapes, P shapes and C shapes, both in hollow and rectangular types. These cross sectional shapes provide the flexibility of placing the gaskets at desired enclosing or mating surfaces.

Reinforced gaskets consist of a corrosion-resistant choseal elastomer base, reinforced with a woven or knitted fabric material. These gaskets are intended for airframe shielding applications, and are widely used in the aerospace and telecommunication industries. The integrally molded reinforcing material provides improved mechanical properties, resulting in gaskets that withstand high levels of wear and abuse, while maintaining the electrical properties of the conductive elastomer base material. The reinforced gaskets are used to provide EMI shielding, lightning protection, high intensity radiated fields (HIRFs) protection, and radar cross section reduction by maintaining surface electrical continuity at joints, seams, and openings in air frames.

Knitted Dacron fabric is used as a reinforcing layer to increase the tensile and tear strength of the elastomer without adding weight to the gasket. Layers of aluminum or "ferrex" wire mesh are used to provide high current-carrying capabilities required for lightning strike protection. Other fabric known as 3M Nextel fabric can also be used for reinforcing purposes. Other reinforcing materials in the form of woven wire mesh of different types are also available to provide fire resistance.

The present invention will now be described with reference to the accompanying drawings. The drawings are being used to illustrate the inventive concept, and are not intended to limit the invention to the embodiments illustrated by them.

FIG. 1 illustrates an enclosure with an attached strip gasket therein, in accordance with an exemplary embodiment of the present invention. The enclosure 100 includes an enclosing surface, a door with attached handle, and a hinge for its operation. The strip gasket 108 is applied on the entire periphery of an inner surface of the door 106 of the enclosure 100. When the door 106 is closed, the strip gasket 108 permeates the enclosing surface 102 and compresses about its entire periphery to provide a good electrical contact or mating.

Figure 2A:
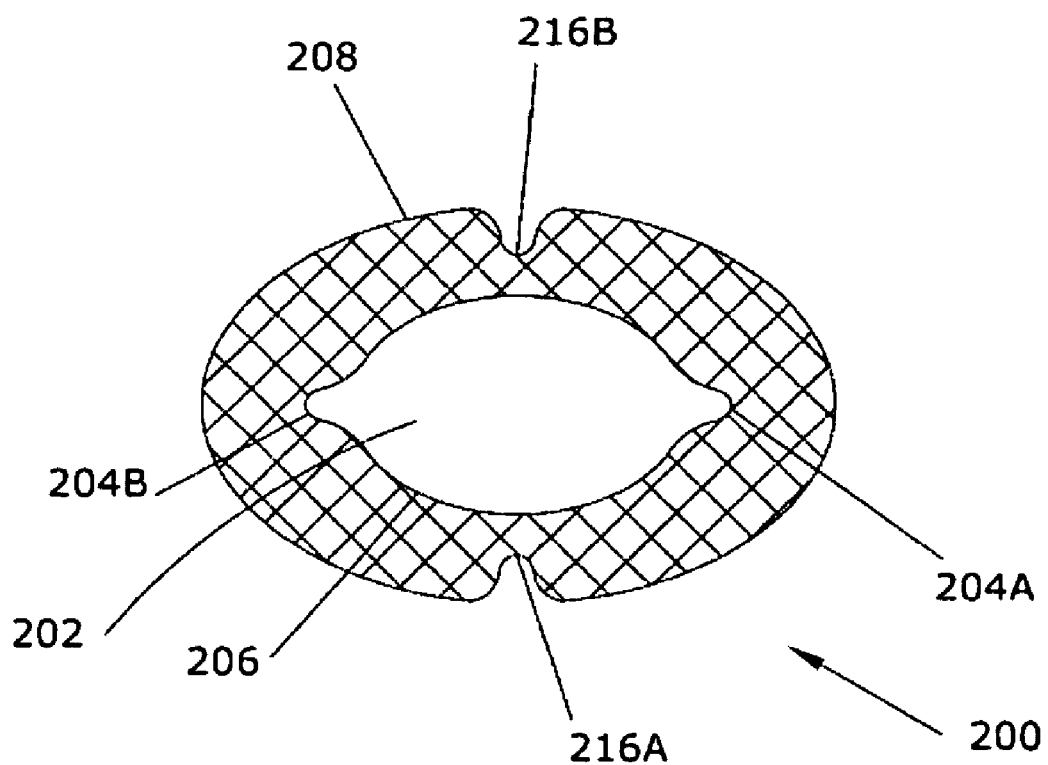
FIG. 2A represents a front view of an O-shaped strip gasket, in accordance with an exemplary embodiment of the present invention.

Referring to FIG. 2A, a front view of an O-shaped strip gasket having an inner surface which provides a hollow cross section region, and an outer surface is shown, in accordance with an embodiment of the present invention. The strip gasket 200 is provided with outer surface 208 and the inner surface 206. The periphery of the inner surface 206 provides a hollow cross section region 202. Further, the inner surface 206 is configured to provide bending moments 204A and 204B, along its periphery. Also, the bending moments 216A and 216B are provided along the outer surface 208 of the strip gasket 200.

The bending moments as shown in FIG. 2A, are defined as the embossing pattern created on a periphery of the outer surface 208 and the inner surface 206. The bending moment 204 and 216 can be created on the periphery of both the inner surface 206 and the outer surface 208 of the strip gasket 200. Alternatively, the bending moment 204 and 216 can be created either on the inner surface 206 or on the outer surface 208 of the strip gasket 200. The amount and position of the bending moments applied on the surfaces of a strip gasket are variable and depend on the overall designs and requirements of the particular application.

Figure 2B:
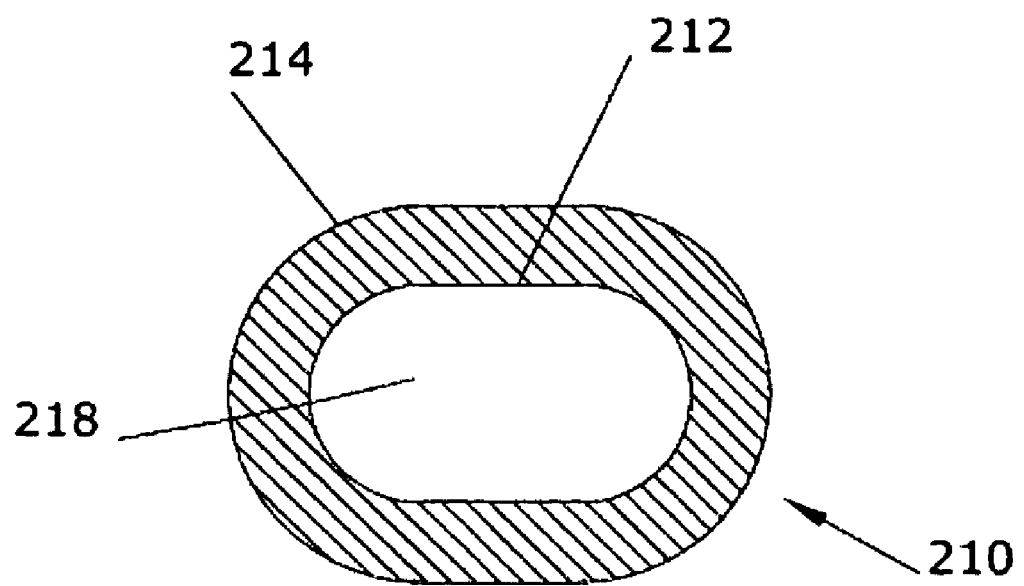
FIG. 2B represents a front view of a conventional O-shaped strip gasket.

A conventional O-shaped strip gasket is shown in FIG. 2B. As shown in FIG. 2B, a front view of conventional O-shaped strip gasket 210 having inner surface 212 and outer surface 214, is depicted. As can be seen in FIG. 2B, conventional O-shaped gasket 210 is provided with the hollow cross section region 218 and is deprived of bending moments.

The bending moments, as described above, are created to provide a low closure force on an enclosing surface. The closure force is defined as a force required for closing the door or panel while obtaining the necessary deflection of the gasket so as to ensure proper electrical mating of the door to the frame through the gasket. Typically the closure force is less than 5 pounds/linear inch.

The bending moments, thus created on the surfaces, provide an increased surface area, and hence increase the effective footprints of an attached gasket. The increased surface area provides a lower resistance, ($R=\rho(L/A)$, where R is the resistance of the cross section surface, $\rho$ is the resistivity of the material used, L is the length and A is the area). Since, resistance is indirectly proportional to the cross section area; an overall resistance decreases with an increased surface area.

Furthermore, the strip gasket 200 satisfies Cauchy's stress under load conditions. According to Cauchy's law, the forces within a body that an enclosed volume imposes on the remainder of the material must be in equilibrium with the forces upon it from the remainder of the body.

The above embodiment describes the O-shaped strip gasket of the invention having a hollow cross section region with bending moments on the inner surface and the outer surface. However, the present invention is not restricted or limited to O-shaped strip gaskets. The present invention also extends to embodiments with different shapes and structures, such as D-shaped, P-shaped, or any other shape having a hollow cross section region with bending moments on the inner surface and the outer surface.

Figure 3A:
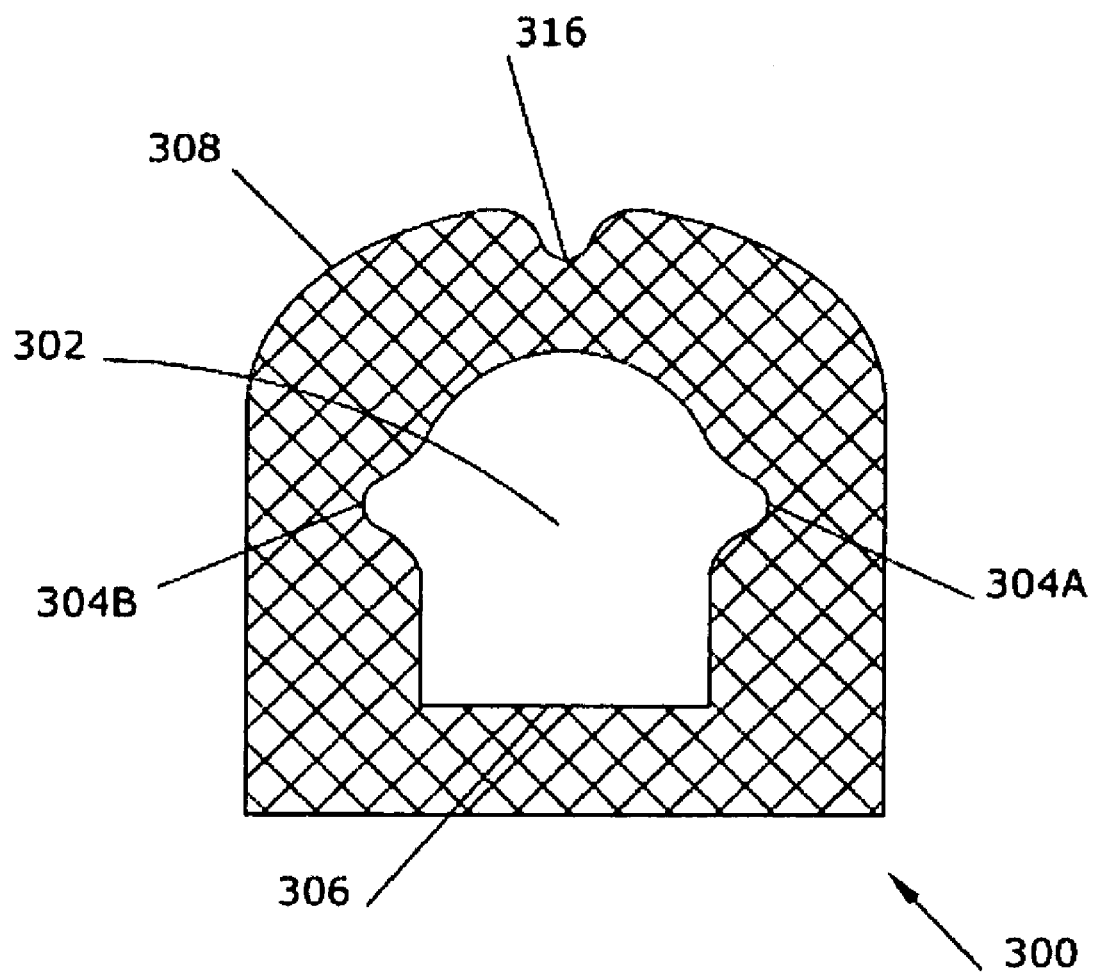
FIG. 3A represents a front view of a D-shaped strip gasket, in accordance with an exemplary embodiment of the present invention.

Referring to FIG. 3A, a front view of an invented D-shaped strip gasket having an inner surface which provides a hollow cross section region and an outer surface is shown, in accordance with another embodiment of the present invention. The strip gasket 300 is provided with outer surface 308 and inner surface 306. The periphery of the inner surface 306 provides the hollow cross section region 302. Further, the inner surface 306 is configured to provide bending moments 304A and 304B, along its periphery. Additionally, bending moment 316 is provided along the outer surface 308 of the strip gasket 300.

Figure 3B:
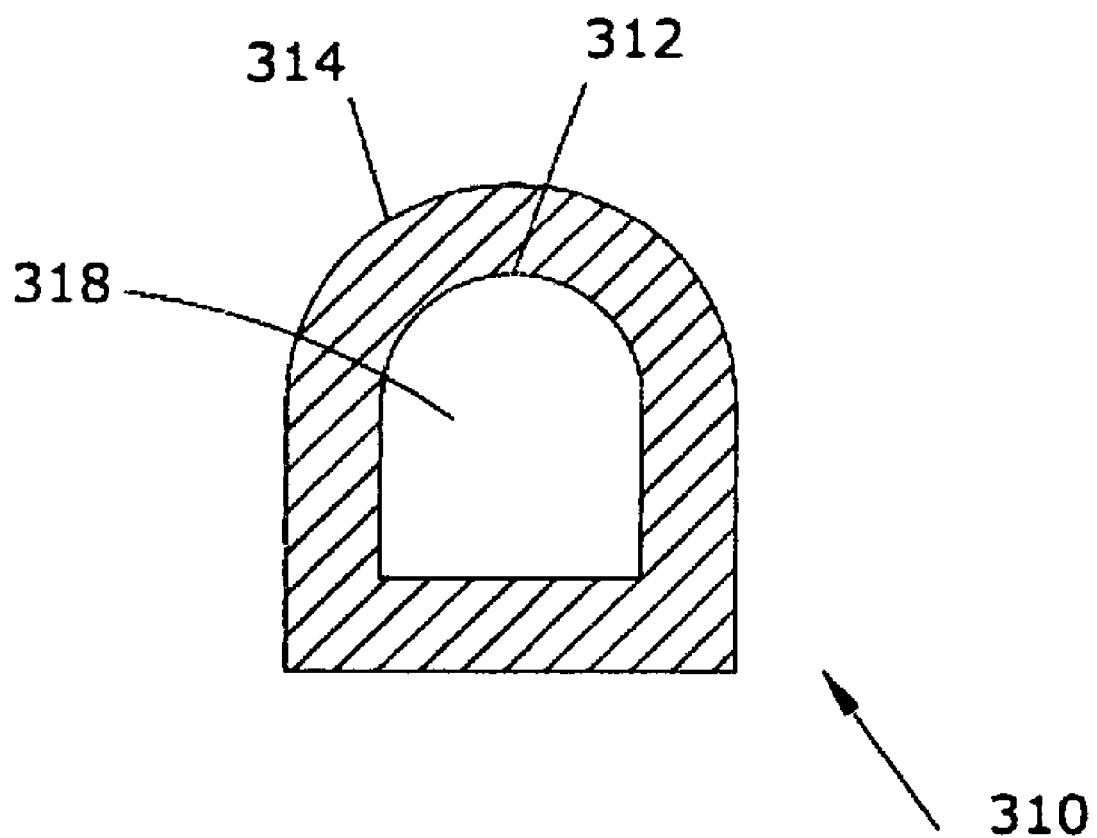
FIG. 3B represents a front view of a conventional D-shaped strip gasket.

A conventional D-shaped strip gasket is shown in FIG. 3B. As shown in FIG. 3B, a front view of conventional D-shaped strip gasket 310 having the inner surface 312 and the outer surface 314, is depicted. As can be seen in FIG. 3B, the conventional D-shaped gasket 310 is provided with a hollow cross section 318 and is deprived of the bending moments.

Figure 4A:
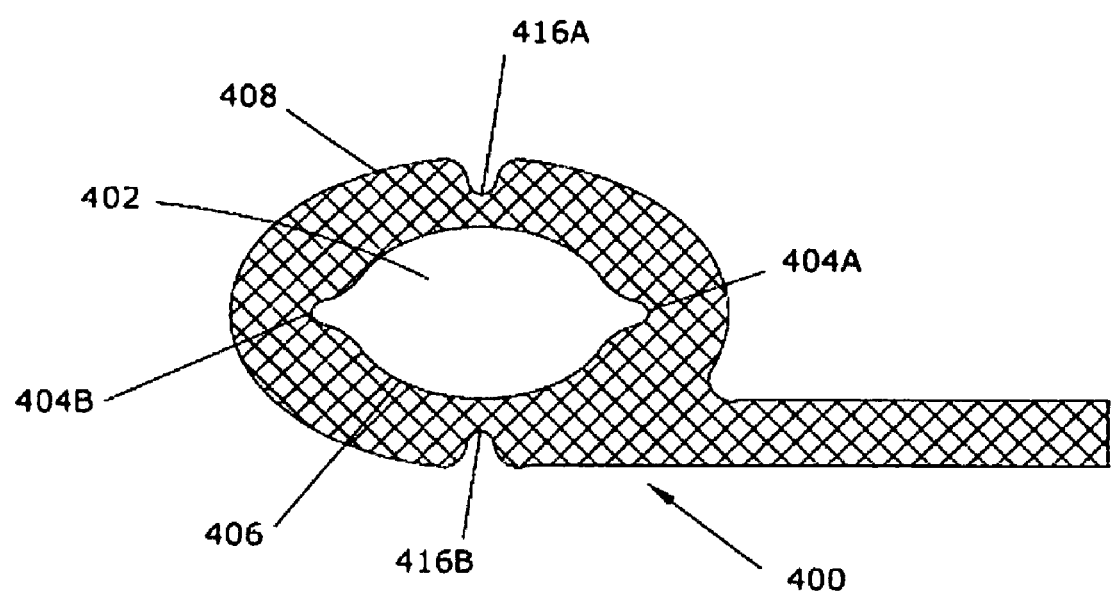
FIG. 4A represents a front view of a P-shaped strip gasket, in accordance with an exemplary embodiment of the present invention.

Referring to FIG. 4A, a front view of an invented P-shaped strip gasket having an inner surface which provides a hollow cross section region and an outer surface is shown, in accordance with yet another embodiment of the present invention. FIG. 4A depicts a front view of P-shaped strip gasket 400. The strip gasket 400 is provided with outer surface 408 and inner surface 406. The periphery of the inner surface 406 provides the hollow cross section region 402. Further, the inner surface 406 is configured to provide bending moments, such as 404A and 404B, along its periphery. Additionally, the bending moments 416A and 416B are provided along the outer surface 408 of strip gasket 400.

Figure 4B:
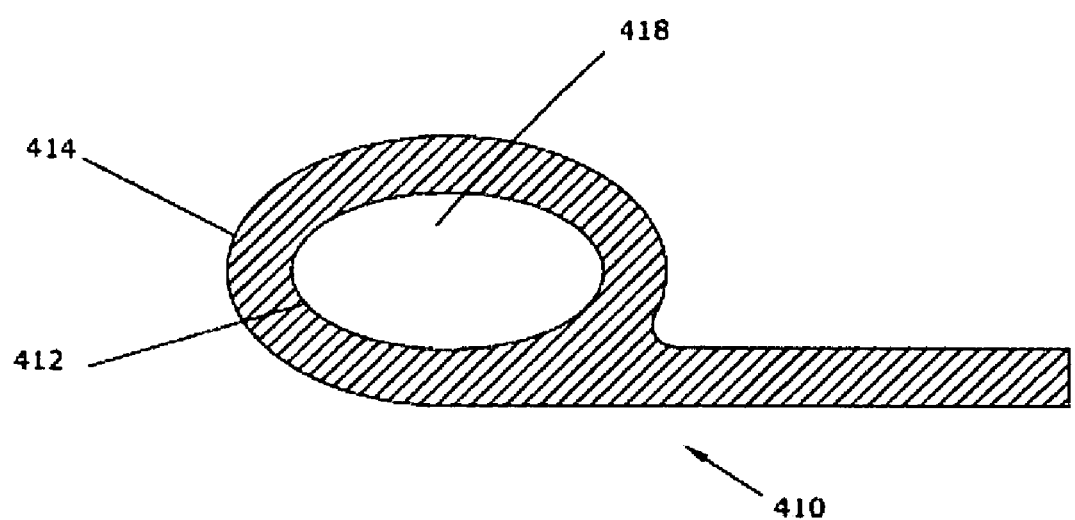
FIG. 4B represents a front view of a conventional P-shaped strip gasket.
Figure 5:
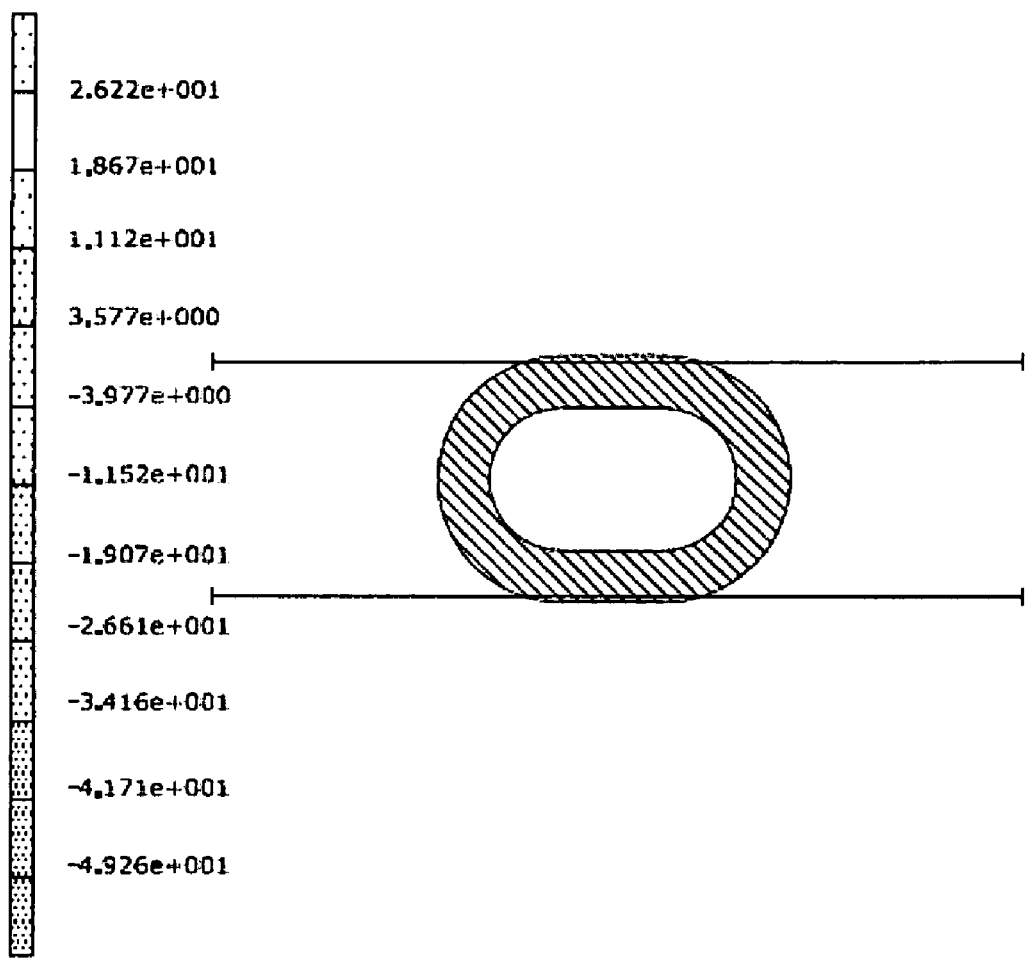
FIG. 5 represents a plot showing nonlinear finite element analysis of the second component of Cauchy stress for a conventional O-shape strip gasket.
Figure 6:
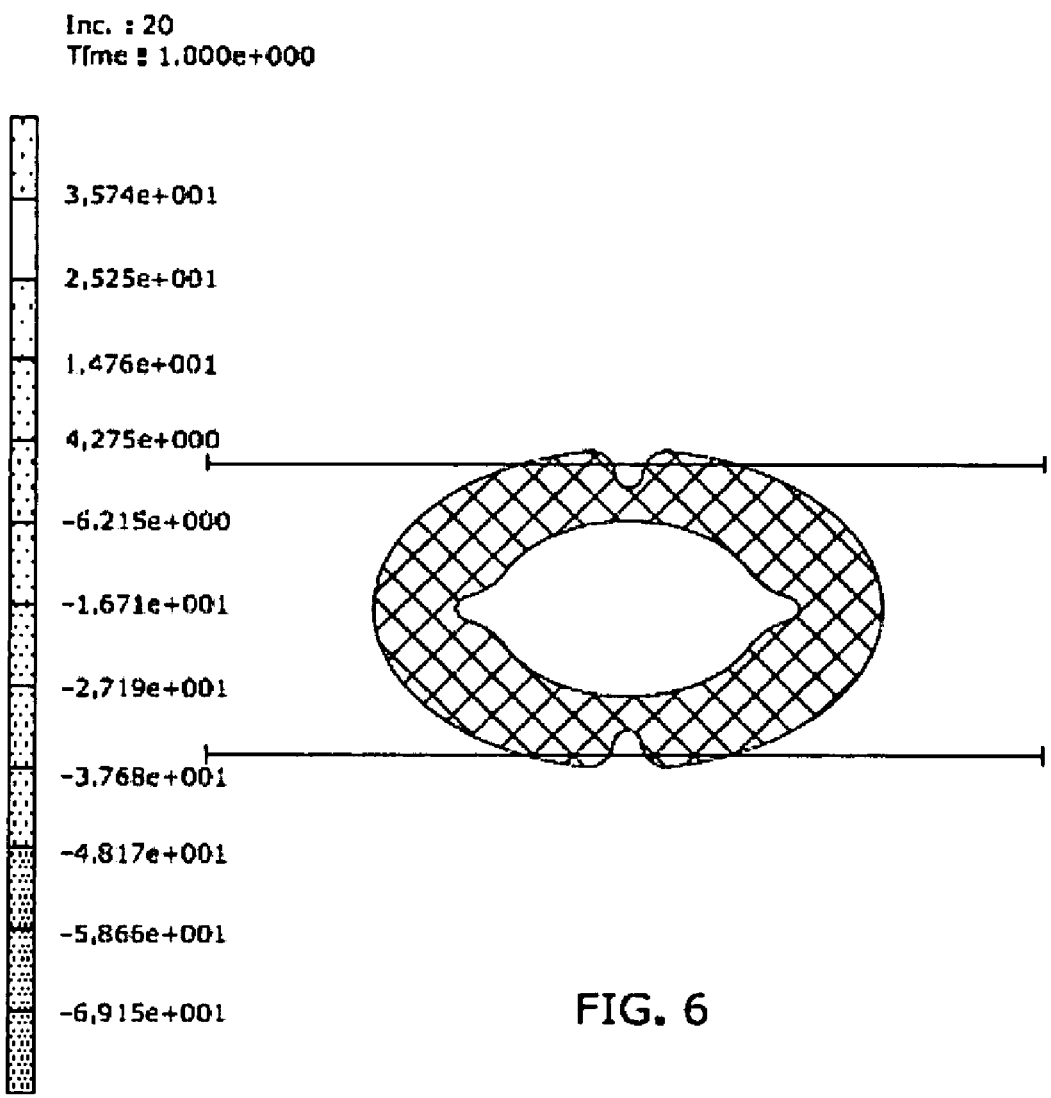
FIG. 6 represents a plot showing nonlinear finite element analysis of the second component of Cauchy stress for an O-shape strip gasket of this invention.
Figure 7:
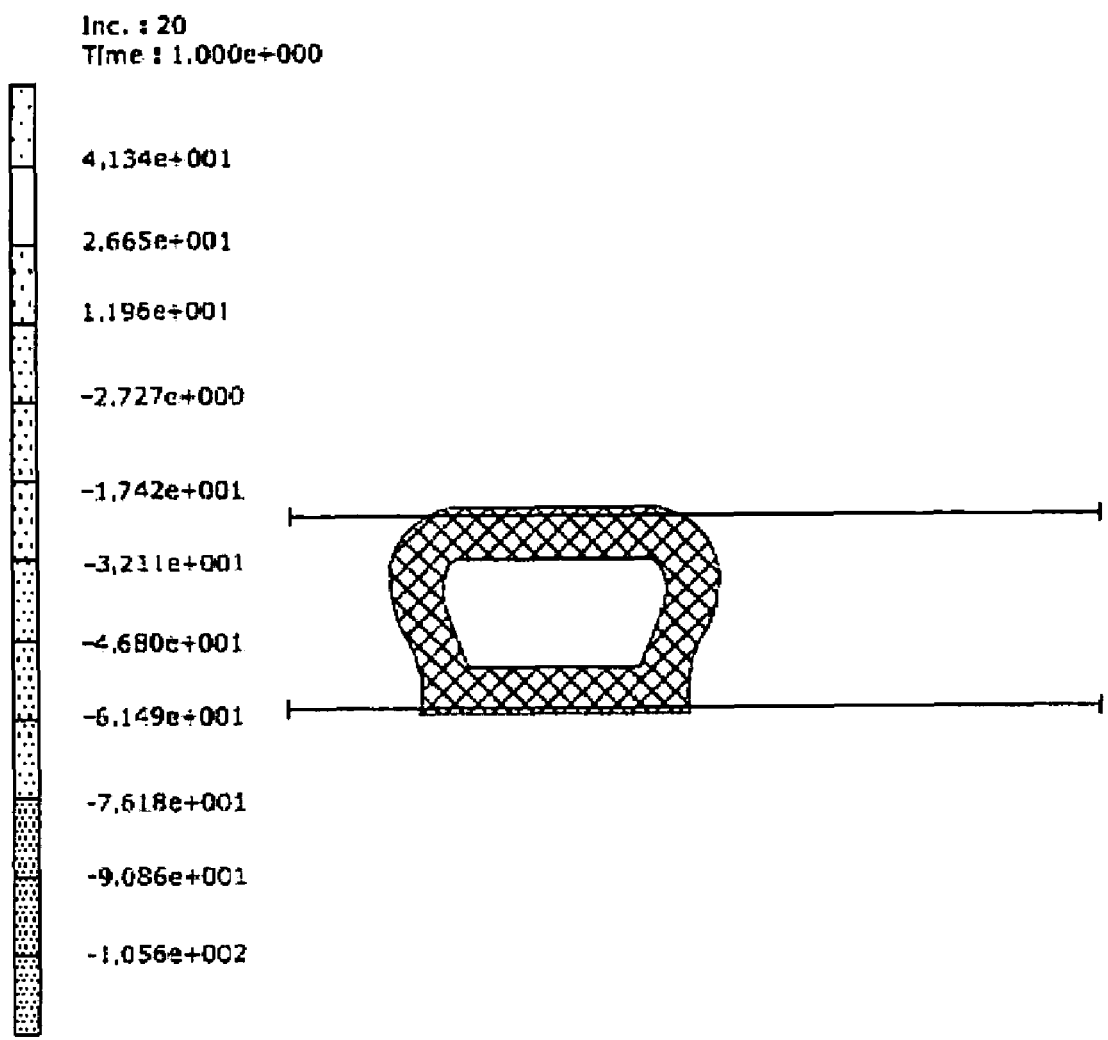
FIG. 7 represents a plot showing nonlinear finite element analysis of the second component of Cauchy stress for a conventional D-shape strip gasket.
Figure 8:
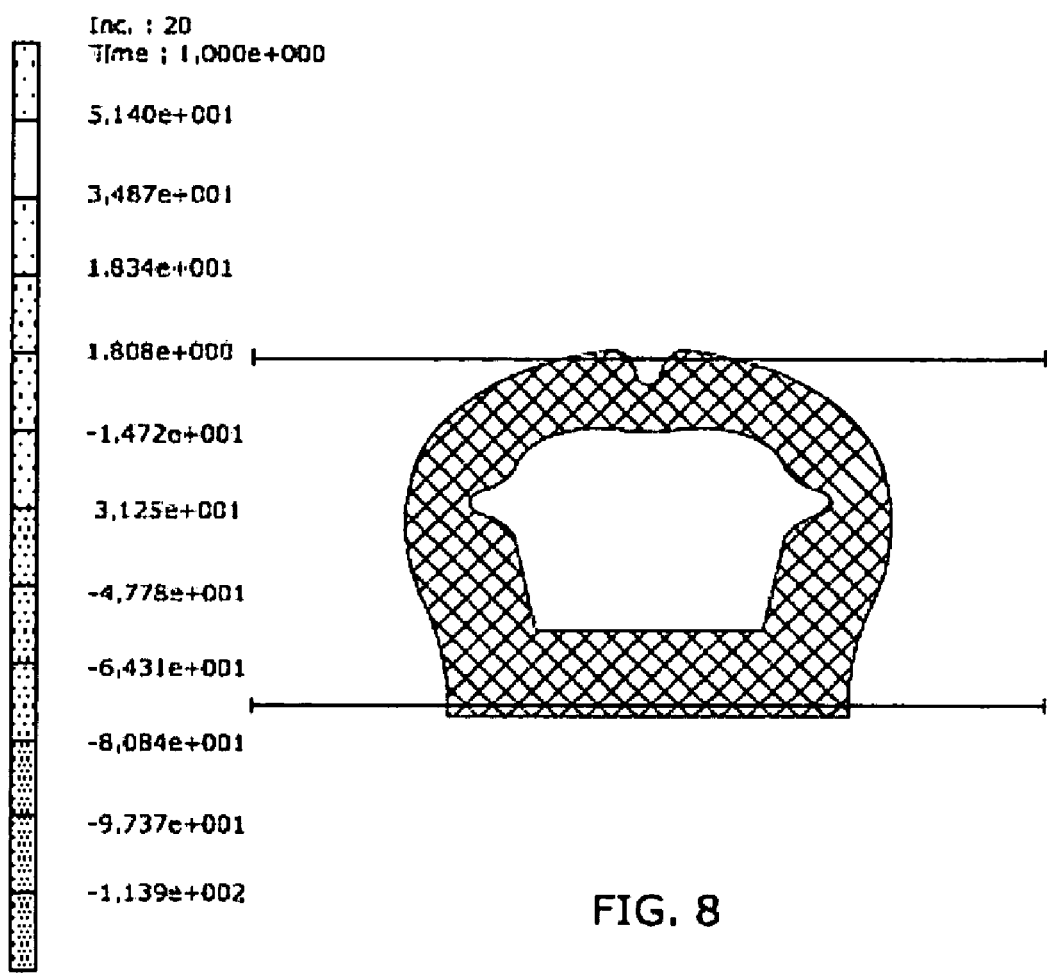
FIG. 8 represents a plot showing nonlinear finite element analysis of the second component of Cauchy stress for a D-shape strip gasket of this invention.
Figure 9:
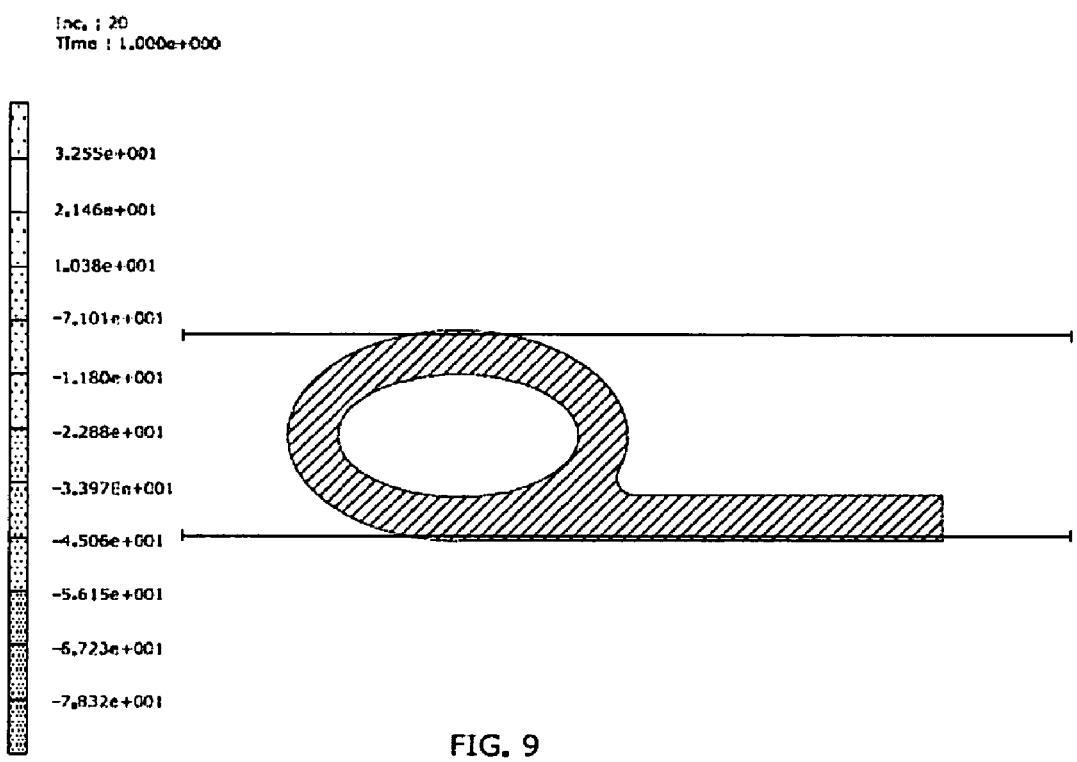
FIG. 9 represents a plot showing nonlinear finite element analysis of the second component of Cauchy stress for a conventional P-shape strip gasket.
Figure 10:
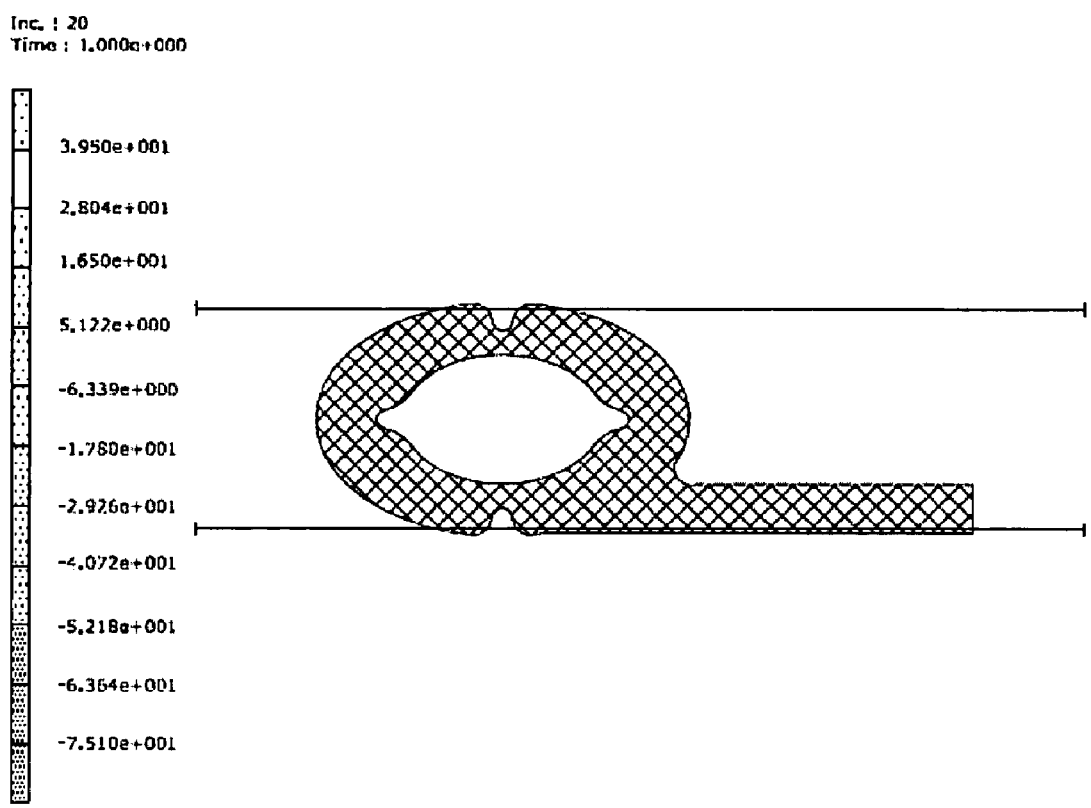
FIG. 10 represents a plot showing nonlinear finite element analysis of the second component of Cauchy stress for a P-shape strip gasket of this invention.

A conventional P-shaped strip gasket is shown in FIG. 4B. As shown in FIG. 4B, a front view of the conventional P-shaped strip gasket 410 having the inner surface 412 and the outer surface 414 is depicted. As can be seen in FIG. 4B, the conventional P-shaped gasket 410 is provided with a hollow cross section 418 and is deprived of the bending moments.

The nonlinear finite element analysis (FEA) approach is used to analyze stress on various gasket geometries shown in FIGS. 5-10. The FEA profiles of the gaskets are plotted for the second component of Cauchy stress at a selected level of deflection.

The following example illustrates the practical and unique features of the invention herein described. It should be understand that this example should not be construed in any limiting sense.

Example

In order to further advantages of the present invention in an actual product configuration, the static load-compression responses of the disclosed gasket profiles configured in accordance with the invention were predicted using a nonlinear finite element analysis (FEA) modeling program, MARC K6 (MSC/MARC/Montat Analysis Research Corp., Palo Alto, Calif.).

Figure 11:
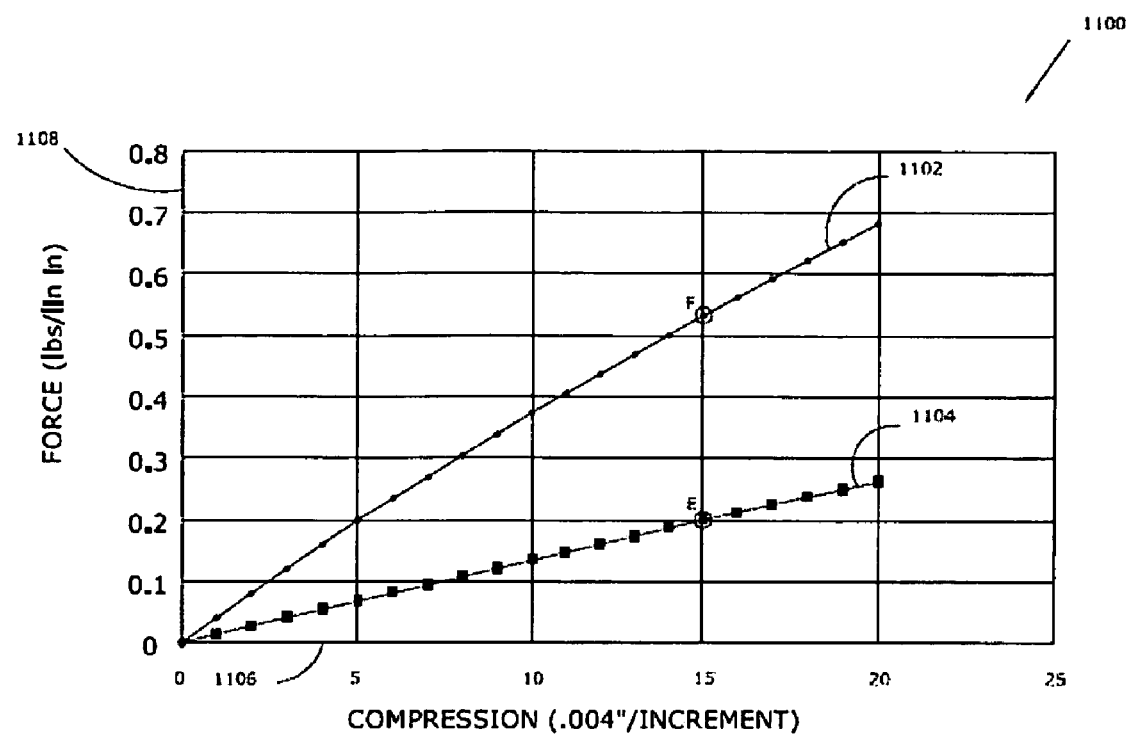
FIG. 11 represents a graph depicting force-compression relation of the strip gasket of FIG. 5 and FIG. 6.

FIG. 11 represents a graph comparing the force-compression aspects of an O-shaped strip gasket with a conventional O-shaped strip gasket, in accordance with an embodiment of the present invention. The graph 1100 defines force on an ordinate axis 1108 (in pounds per linear inch required to compress the gasker) and compression on abscissa axis 1106 (in 0.004 inches per increment). The graph 1100 shows the parameters of compression produced when a specified force is applied to the surface of a strip gasket. A curve 1102 represents the variations of compression produced on the gasket when a force is applied to the conventional O-shaped strip gasket. A curve 1104 represents the variations of compression produced on the gasket when a force is applied to the O-shaped strip gasket of the invention.

The analysis in FIG. 11 shows the compression of the gasket from the free state with each increment of compression being 0.004 inches. The force required for compression is measured in pounds per linear inch. As can be seen from FIG. 11, the force deflection curve of the O-shaped strip gasket of the invention lies below the force deflection curve of the conventional O-shaped strip gasket. For example, a force of 0.2 units is applied to the O-shaped strip gasket of the invention to produce a compression value of 15 units as shown by point E on curve 1104. Similarly, in direct comparison, a force of 0.54 units is applied to the conventional O-shaped strip gasket to produce the same compression value (15 units) as shown by point F on curve 1102. As can be seen from the graph, to produce a specific compression in the conventional O-shaped strip gasket requires more force than in the O-shaped strip gasket of the invention.

As can be seen from FIG. 11, the O-shaped strip gasket of the invention requires a low closure force as compared to a conventional O-shaped strip gasket. The low closure force is achieved through bending moments generated on an inner surface or an outer surface of a hollow gasket structure.

Figure 12:
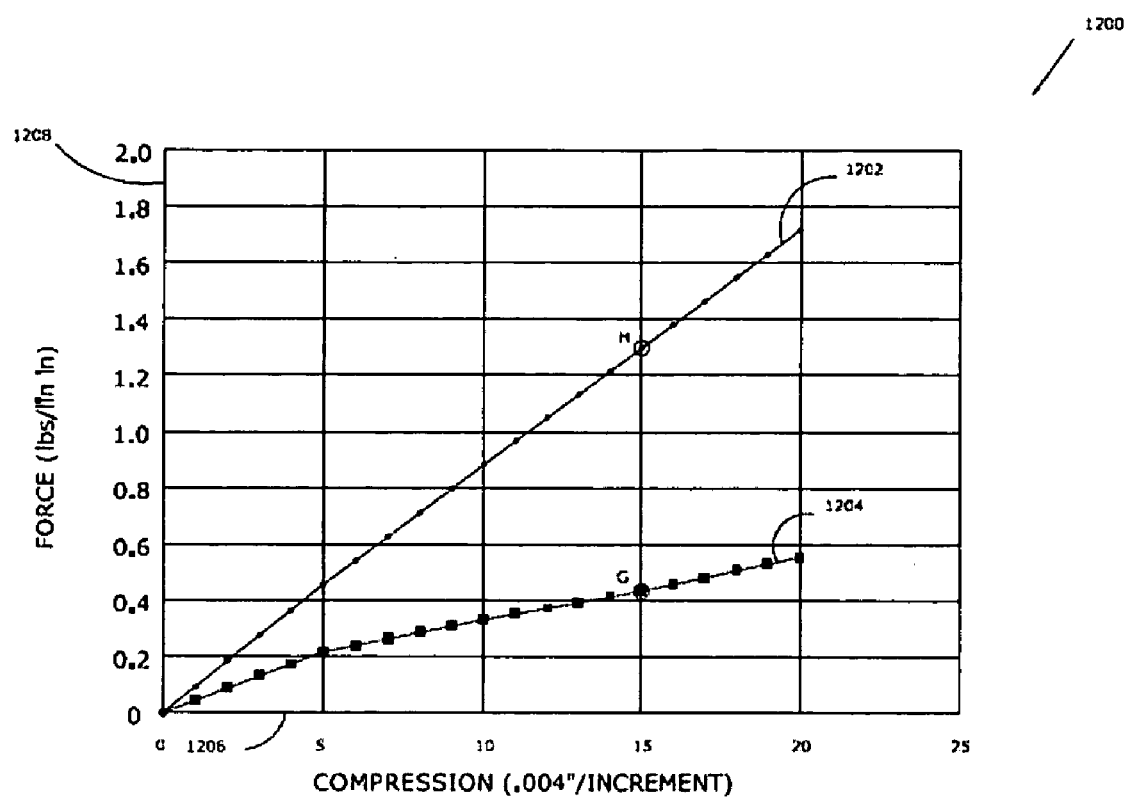
FIG. 12 represents a graph depicting force-compression relation of the strip gasket of FIG. 7 and FIG. 8.

FIG. 12 represents a graph comparing the force-compression aspects of a D-shaped strip gasket with a conventional D-shaped strip gasket, in accordance with another embodiment of the present invention. The graph 1200 defines a force on an ordinate axis 1208 (in pounds per linear inch) and compression on abscissa axis 1206 (in 0.004" per increment). The graph 1200 shows parameters of compression produced when a specified force is applied to the surface of a strip gasket. A curve 1202 represents the variations of compression produced on the gasket when a force is applied on the conventional D-shaped strip gasket. A curve 1204 represents the variations of compression produced on the gasket when a force is applied to the D-shaped strip gasket of the invention. As can be seen from the plot, the force deflection curve of the D shaped strip gasket of the invention lies below the force deflection curve of the conventional D shaped strip gasket. For example, a force of 0.42 units is applied to the D-shaped strip gasket of the invention to produce a compression value of 15 units as shown by point G on curve 1204. Similarly, in direct comparison, a force of 1.3 units is applied to the conventional D-shaped strip gasket to produce the same compression value (15 units) as shown by point H on curve 1202. As can be seen from the graph, to produce a specific compression in the conventional D-shaped strip gasket requires more force than in the D-shaped strip gasket of the invention.

As can be seen from FIG. 12, the D-shaped strip gasket of the invention requires a low closure force as compared to a conventional D-shape strip gasket. The low closure force is achieved through bending moments generated on an inner surface or an outer surface of a hollow gasket structure.

Figure 13:
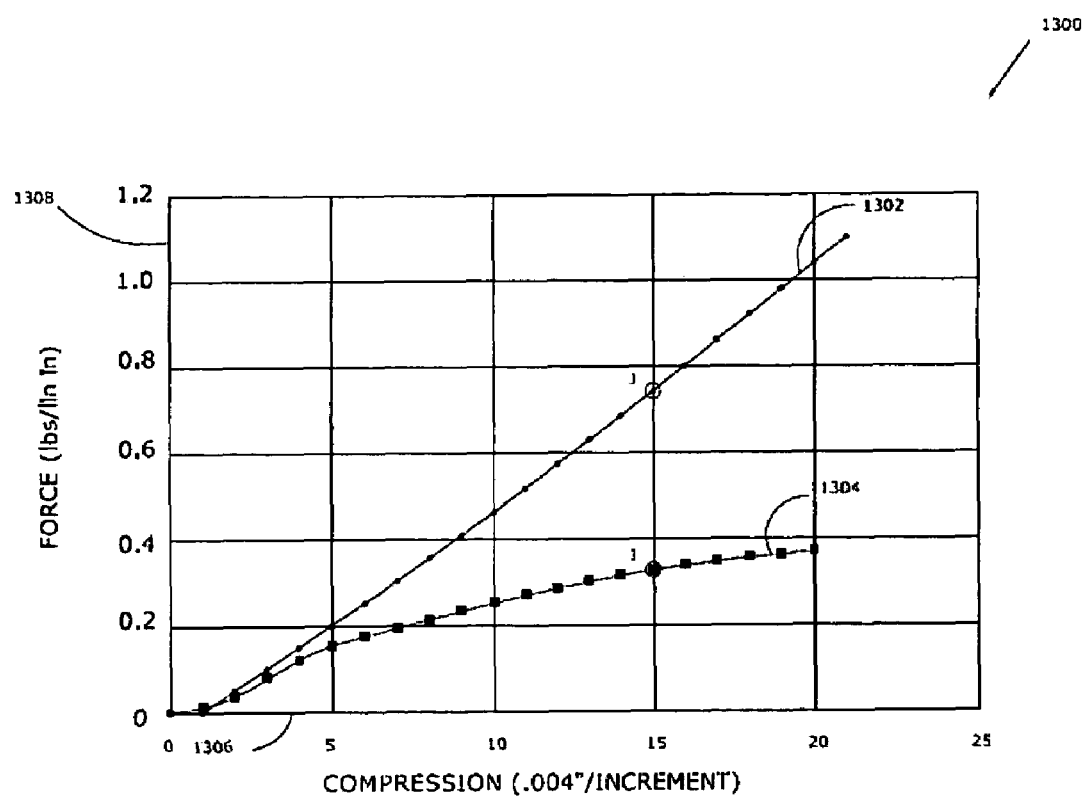
FIG. 13 represents a graph depicting force-compression relation of the strip gasket of the FIG. 9 and FIG. 10.

FIG. 13 represents a graph comparing the force-compression aspects of an invented P-shaped strip gasket with a conventional P-shaped strip gasket, in accordance with yet another embodiment of the present invention. The graph 1300 defines a force on an ordinate axis 1308 (in pounds per linear inch) and compression on abscissa axis 1306 (in 0.004" per increments). The graph 1300 shows parameters of compression produced when a specified force is applied to the surface of a strip gasket. A curve 1302 represents the variations of compression produced on the gasket when a force is applied to the conventional P-shaped strip gasket. A curve 1304 represents the variations of compression produced on the gasket when a force is applied to the P-shaped strip gasket of the invention. As can be seen from the plot, the force deflection curve of the P-shaped strip gasket of the invention lies below the force deflection curve of the conventional P-shaped strip gasket. For example, a force of 0.35 units is applied to the P-shaped strip gasket of the invention to produce a compression value of 15 units as shown by point I on the curve 1304. Similarly, in direct comparison, a force of 0.75 units is applied to the conventional P-shaped strip gasket to produce the same compression value (15 units) as shown by point J on curve 1302. As can be seen from the graph, to produce a specific compression in the conventional P-shaped strip gasket requires more force than in the P-shaped strip gasket of the invention.

As can be seen from FIG. 13, the P-shaped strip gasket of the invention requires a low closure force as compared to a conventional P shape strip gasket. The low closure force is achieved through bending moments generated on an inner surface or an outer surface of a hollow gasket structure.

The strip gaskets of the present invention are designed to meet the stringent shielding and mechanical performance requirements of today's commercial telecommunication and aerospace industries. The successful optimization of the electronically conductive jacket and the soft foam core results in a product that has excellent EMI shielding performance and an ultra-low closure force.

The strip gasket of the present invention offers many advantages. The strip gasket can be implemented to provide environmental sealing or Electromagnetic Interference (EMI)/Radio frequency Interference (RFI) shielding for multiple enclosures. The strip gasket provides easy installation, is available in flexible shapes for adjusting to multiple surfaces, and can be easily attached in multiple ways to the enclosure to provide effective shielding. Furthermore, the strip gasket has a hollow cross sectional area with bending moments along its periphery to provide a low closure force on an enclosing surface, and it can be fixed at desired locations for optimum performance.

Various other embodiments are possible within the spirit of the invention, and the aforementioned embodiments are for explanatory purposes only and are not intended to limit the invention in any manner. The strip gasket can be made in desired shapes from various kinds of materials available in the field and known to a person skilled in the art. The invention intends to cover all the equivalent embodiments and is limited only by the appended claims.

What is claimed is:

1. A shielding strip gasket providing a low closure force on an enclosing face comprising:
    an outer surface;
    an inner surface; said inner surface having a hollow cross sectional region; and
    at least one bending moment embossed on the periphery of said inner surface and at least one bending moment embossed on the periphery of said outer surface, wherein at least one bending moment is positioned along the vertical axis of the gasket, and at least one bending moment is positioned along the horizontal axis of the gasket.

2. The strip gasket as claimed in claim 1, wherein at least two bending moments are positioned on said inner surface or said outer surface in opposed relationship.

3. The strip gasket as claimed in claim 1, wherein said gasket is selected from the group consisting of a molded gasket, an extruded gasket, and a reinforced gasket.

4. The strip gasket as claimed in claim 1, wherein said hollow cross sectional region has a shape selected from the group consisting of a D shape, a rectangular shape, a P shape, an O shape, and a C shape.

5. The strip gasket as claimed in claim 1, wherein said gasket is reinforced using a Dacron fabric.

6. The strip gasket as claimed in claim 1, wherein said gasket is reinforced using a wire selected from the group consisting of an aluminum wire and a ferrex wire.

7. The strip gasket as claimed in claim 1, wherein said gasket comprises a conductive elastomer or a non conductive elastomer.

8. The strip gasket as claimed in claim 1, wherein said strip gasket is used for electromagnetic interference shielding or radiofrequency interference shielding.

* * * * *